US008166653B2

(12) United States Patent
Park et al.

(10) Patent No.: US 8,166,653 B2
(45) Date of Patent: May 1, 2012

(54) METHOD OF MANUFACTURING PRINTED CIRCUIT BOARD HAVING EMBEDDED RESISTORS

(75) Inventors: Hwa Sun Park, Gyunggi-do (KR); Tae Eui Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 171 days.

(21) Appl. No.: 12/801,870

(22) Filed: Jun. 29, 2010

(65) Prior Publication Data

US 2010/0269335 A1    Oct. 28, 2010

Related U.S. Application Data

(62) Division of application No. 11/976,760, filed on Oct. 26, 2007, now abandoned.

(30) Foreign Application Priority Data

Nov. 13, 2006 (KR) .................. 10-2006-0111733

(51) Int. Cl.
*H01K 3/10* (2006.01)

(52) U.S. Cl. ............ 29/852; 29/25.42; 29/831; 29/832; 29/846; 29/847

(58) Field of Classification Search ............... 29/25.42, 29/830, 831, 832, 852, 846, 847; 360/306.1, 360/306.3, 236.3, 237; 361/794, 780, 792, 361/793, 795; 174/255, 256
See application file for complete search history.

(56) References Cited

U.S. PATENT DOCUMENTS

| | | | |
|---|---|---|---|
| 3,909,680 A | 9/1975 | Tsunashima | |
| 6,353,540 B1 * | 3/2002 | Akiba et al. | 361/794 |
| 6,446,317 B1 * | 9/2002 | Figueroa et al. | 29/25.42 |
| 6,734,542 B2 * | 5/2004 | Nakatani et al. | 257/687 |
| 6,872,893 B2 | 3/2005 | Fukuoka et al. | |
| 6,985,364 B2 * | 1/2006 | Higashitani et al. | 361/763 |

FOREIGN PATENT DOCUMENTS

| JP | 406036902 | 2/1994 |
|---|---|---|
| JP | 409321404 | 12/1997 |

OTHER PUBLICATIONS

U.S. Appl. No. 11/976,760, filed Oct. 26, 2007, Hwa Sun Park et al., Samsung Electro-Mechanics Co., Ltd.
U.S. Office Action dated Jun. 10, 2009, issued in the file history of U.S. Appl. No. 11/976,760.
U.S. Office Action dated Dec. 7, 2009, issued in the file history of U.S. Appl. No. 11/976,760.
U.S. Office Action dated Mar. 31, 2010, issued in the file history of U.S. Appl. No. 11/976,760.

* cited by examiner

*Primary Examiner* — Derris Banks
*Assistant Examiner* — Tai Nguyen

(57) ABSTRACT

A method of manufacturing a printed circuit board (PCB) having embedded resistors, including providing a PCB on which internal layer circuit patterns, including electrode pads, are formed; layering insulating layers on the PCB; forming first via holes on the electrode pads and simultaneously forming second via holes at predetermined locations on the internal layer circuit patterns; forming contact pads for connecting the electrode pads with resistors by filling the first via holes with oxidation-resistant conductive material and flattening the oxidation-resistant conductive material; forming the resistors so that ends of each resistor are connected to two respective contact pads, which are spaced apart from each other; forming circuit patterns on the PCB, in which the second via holes are formed; and layering insulting layers on the PCB having the formed circuit patterns, and forming external layer circuit patterns.

14 Claims, 3 Drawing Sheets

METHOD OF MANUFACTURING PRINTED CIRCUIT BOARD HAVING EMBEDDED RESISTORS

CROSS-REFERENCE TO RELATED APPLICATIONS

This application is a divisional and claims priority to U.S. application Ser. No. 11/976,760, filed Oct. 26, 2007 now abandoned, which in turn claims the benefit of Korean Patent Application 10-2006-0111733, filed with the Korean Intellectual Property Office on Nov. 13, 2006, the disclosures of which are incorporated herein by reference in their entirety.

BACKGROUND

1. Field

Embodiments relate generally to a method of manufacturing a printed circuit board having embedded resistors. More particularly, the embodiments relate to a method of manufacturing a printed circuit board having embedded resistors, in which contact pads are formed by filling via holes formed on electrode pads with oxidation-resistant conductive material, and resistors are formed on the contact pads, thus not only reducing the differences between the resistance values of the embedded resistors, but also preventing erosion from occurring between the electrode pads and the resistors.

2. Description of the Related Art

In electronic products including recent portable electronic devices, various demands from consumers are increasing. In particular, consumers' desires for multiple functions, a small size and light weight, a high speed, a low price, increased convenience of movement, real-time wireless connection with the Internet, refined design and the like cause developers, designers and manufacturers to feel greatly burdened in the manufacturing of high-quality products. Such increased competition leads rival manufacturers to market new models on a daily basis. This increases again the burden on all persons concerned.

As the functions of products becomes diverse in this manner, the number of passive elements increases relative to the increase in the number of Integrated Circuits (ICs), and thus the size of portable terminals also increases. Generally, in an electronic device, a plurality of active elements and a plurality of passive elements are mounted on the surfaces of a circuit board. In order to facilitate the transmission of signals between the active elements, a large number of passive elements are surface-mounted in the form of discrete chip resistors.

As a part of an effort to realize high density mounting for an electronic system, development for embedded Printed Circuit Boards (PCBs) is being conducted by the large number of manufacturers concerned. Passive elements embedded in such a board are classified into Resistors R, inductors L and capacitors C according to type, and embedded elements are classified into existing thin passive elements, film elements formed using printing or sputtering, and plating-type elements based on plating according to size and form. However, discrete chip resistors, that is, passive elements have a limitation in the ability to satisfy the trend of making electronic products light, thin, short and small using only, have a problem with the use of space, and have a disadvantage in that the cost is increased.

Accordingly, various attempts to embed film-type resistors having a thickness of 15~25 μm, which belong to passive elements, in a board have been made. In order to embed such film-type resistors in a board, methods such as screen printing, sputtering and plating are employed. In particular, screen printing is advantageous in that the number of element mounting processes can be reduced and the cost can be reduced. Furthermore, screen printing is advantageous in that the reliability of contact can be improved, light weight can be realized, and environmental loads can be reduced, because the number of solder joints is reduced.

Technology for embedding resistors in a PCB using an existing printing technique includes various forms and processes. According to an embodiment of a prior art, as shown in FIGS. 2A and 2B, resistors 5 are formed by forming electrode pads 1 and 2 on an insulating board 6, and printing resistor paste between the electrode pads 1 and 2, which are spaced apart from each other, using a photoresist film 3 as a resist. However, the prior art is problematic in that poor printability of the resistors 5 results due to the differences in height between the electrode pads 1 and 2 and the insulating board 6, so that the formed shapes thereof become irregular, thereby resulting in increased differences between the resistance values. When the resistance values are measured after the resistor paste has been formed through printing as described above, a problem occurs when performing laser trimming if the resistance values are greater or much smaller than a target resistance value. The trimming cannot be performed when the resistance values of the printed resistors are large, and a problem with the reliability thereof may be caused when the resistance values of the printed resistors are very small. Such error results in decreased yield with increased incidence of defects and ultimately degrades the performance of products, and therefore it is considered to be the factor most urgently requiring improvement.

SUMMARY OF THE INVENTION

Accordingly, in order to solve the above-described problems, extensive research has been continuously conducted. As a result thereof, contact pads are formed by filling via holes formed on electrode pads with oxidation-resistant conductive material, and resistors are formed on the contact pads, and therefore embedded resistors having a desired size can be manufactured with high reliability without error or great variation. Based on this, the present invention was completed.

Accordingly, an aspect of the present invention is to provide a PCB having embedded resistors and a method of manufacturing the same, in which resistors are formed without any difference in the height thereof attributable to electrode pads, thus reducing the differences between the resistance values of the embedded resistors.

Another aspect of the present invention is to provide a PCB having embedded resistors and a method of manufacturing the same, which can not only prevent erosion from occurring between the electrode pads and the resistors, but also realize a desired resistance value with high accuracy and high reliability.

In order to accomplish the above objects, the present invention provides a PCB having embedded resistors, including (a) a plurality of circuit layers comprising circuit patterns including electrode pads formed on an internal circuit layer; (b) a plurality of insulating layers located between respective circuit layers; (c) a plurality of via holes formed in the insulating layers to enable interlayer electrical connections; (d) contact pads formed by filling the via holes, which are formed on the electrode pads, with oxidation-resistant conductive material; and (e) resistors connected with the electrode pads, and formed such that the ends of each resistor are connected to two respective contact pads, which are spaced apart from each other, at the surfaces of the contact pads, which are on the opposite side from the surfaces of the contact pads that are in contact with the electrode pads, and thus connected in the same plane.

The oxidation-resistant conductive material may be Ag paste.

It is preferred that the resistors be formed through screen printing of resistor material, and the resistor material is, preferably, carbon-based paste.

In addition, the present invention provides a method of manufacturing a PCB having embedded resistors, the method including (a) providing a PCB on which internal layer circuit patterns, including electrode pads, are formed; (b) layering insulating layers on the PCB; (c) forming first via holes on the electrode pads and simultaneously forming second via holes at predetermined locations on the internal layer circuit patterns; (d) forming contact pads for connecting the electrode pads with resistors by filling the first via holes with oxidation-resistant conductive material and flattening the oxidation-resistant conductive material; (e) forming the resistors so that the ends of each resistor are connected to two respective contact pads, which are spaced apart from each other; (f) forming circuit patterns on the PCB, in which the second via holes are formed; and (g) layering insulting layers on the PCB obtained at step (f), and forming external layer circuit patterns.

In addition, the present invention provides a method of manufacturing a printed circuit board having embedded resistors, the method including (a) providing a PCB on which internal layer circuit patterns, including electrode pads, are formed; (b) layering insulating layers on the PCB; (c) forming first via holes on the electrode pads; (d) forming contact pads for connecting the electrode pads with resistors by filling the first via holes with oxidation-resistant conductive material and flattening the oxidation-resistant conductive material; (e) forming the resistors so that the ends of each resistor are connected to two respective contact pads, which are spaced apart from each other; (f) forming second via holes at predetermined locations on the internal layer circuit patterns; (g) forming circuit patterns on the PCB, in which the second via holes are formed; and (h) layering insulting layers on the PCB obtained at step (g), and forming external layer circuit patterns.

Preferably, the filling of the oxidation-resistant conductive material is performed using screen printing.

The flattening may be performed through a mechanical polishing process, a chemical polishing process, or a chemical mechanical polishing process.

Performing laser trimming using the circuit patterns, formed at step (f) of the first method or formed at step (g) of the second method, as pads may be further included.

BRIEF DESCRIPTION OF THE DRAWINGS

The above and other objects, features and advantages of the present invention will be more clearly understood from the following detailed description taken in conjunction with the accompanying drawings, in which:

FIGS. 2A and 2B are sectional views schematically showing a process of manufacturing a board having embedded resistors according to an embodiment of a prior art.

DETAILED DESCRIPTION OF THE EMBODIMENTS

The present invention is described in detail with reference to the accompanying drawings below.

FIGS. 1A to 1H schematically show a process of manufacturing a PCB having embedded resistors according to a preferred embodiment of the present invention.

Figure 1A:
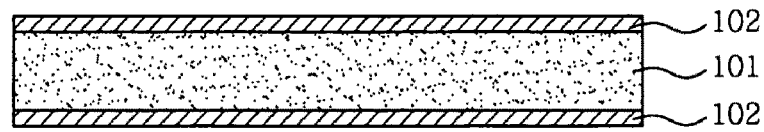
FIGS. 1A to 1H are sectional views schematically showing a process of manufacturing a PCB having embedded resistors according to a preferred embodiment of the present invention.

First, a resin board 101, which is generally used in the art and has conductive metal layers 102 layered on both surfaces thereof, is prepared (refer to FIG. 1A). Although, in the present drawing, the conductive metal layers 102 are shown as being layered on both surfaces of the PCB, a selective layering process may also be performed on either of the two surfaces of the PCB as needed. Although the conductive metal layers 102 are limited to any specific material as long as they are well known in the art, copper Cu is typically used for the conductive metal layers 102. All of resin boards, as long as they are well known in the art, may be used as the resin board 101, that is, the resin board 101 is not limited to any specific board.

Figure 1B:
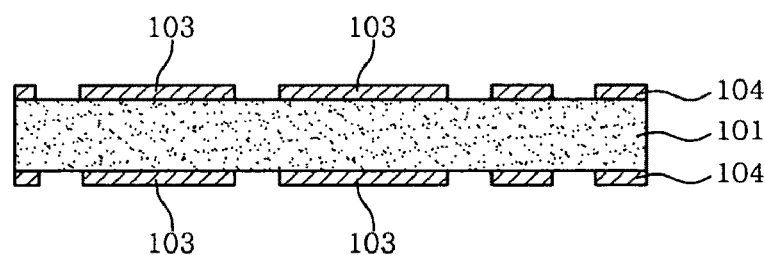

Thereafter, the conductive metal layers 102 are patterned using a circuit forming process, for example, using exposure/development and etching methods, which are well known in the art, and thus internal layer circuit patterns 104 including electrode pads 103 are formed (refer to FIG. 1B).

Figure 1C:
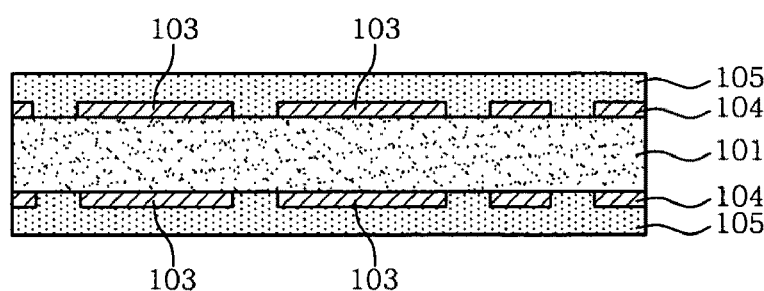

Subsequently, insulating layers 105 are layered on the PCB on which the internal layer patterns 104 are formed (refer to FIG. 1C). All of insulating layers, as long as they are well known in the art, may be used as the insulating layers 105, that is, the insulating layers 105 are not limited to any specific insulating layer. In particular, it is advantageous to use resin material, such as ABF, which has an excellent degree of flatness and enables the shape thereof to be kept uniform by minimizing the flow of resistor material, thus enabling the design size of resistors to predict the actual resultant resistors with great accuracy in a subsequent process.

Figure 1D:
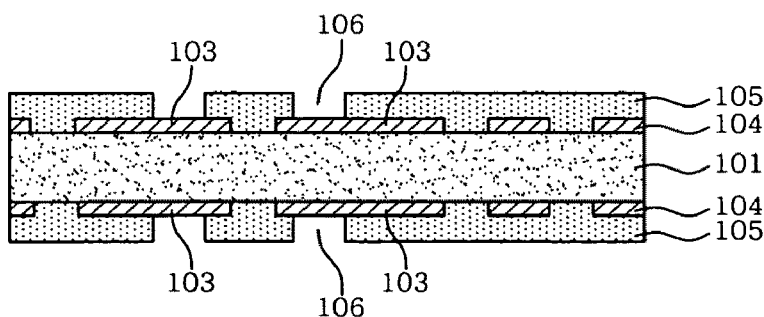

Thereafter, the insulating layers 105 on the electrode pads 103 are processed through a general via forming process, and thus first via holes 106 are formed (refer to FIG. 1D). In this case, second via holes 109 may be formed at predetermined locations on the circuit patterns 103 and 104 at the same time as the first via holes 106, but the case where only the second via holes 109 are formed through a subsequent process is shown in the present drawing.

Figure 1E:
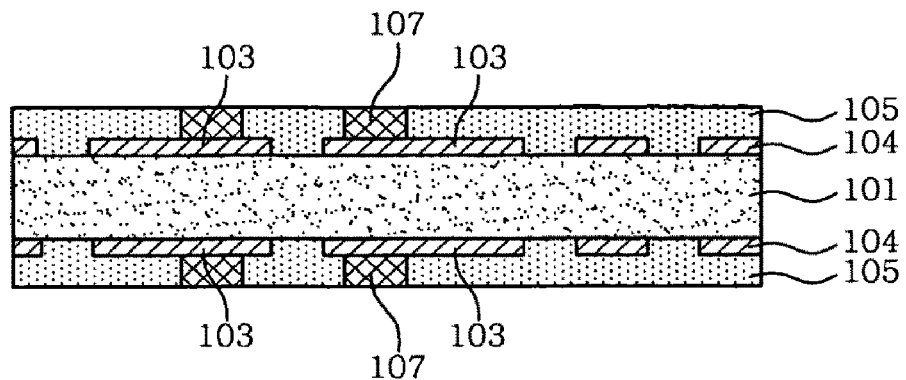

The first via holes 106 are filled with Oxidation-resistant conductive material, preferably, Ag paste, using screen printing (refer to FIG. 1E). In this case, the conductive material, which is printed to protrude outside the via-holes 106, is flattened through a mechanical polishing process, a chemical polishing process or a chemical mechanical polishing process, such as buffing, which is well known in the art, and thus contact pads 107 for connecting the electrode pads 103 with resistors 108 are formed. The contact pad 107, formed as described above, functions not only to merely connect the electrode pads 103 with the resistors 108, but also to prevent erosion from occurring between the electrode pads 103 and the resistors 108.

Figure 1F:
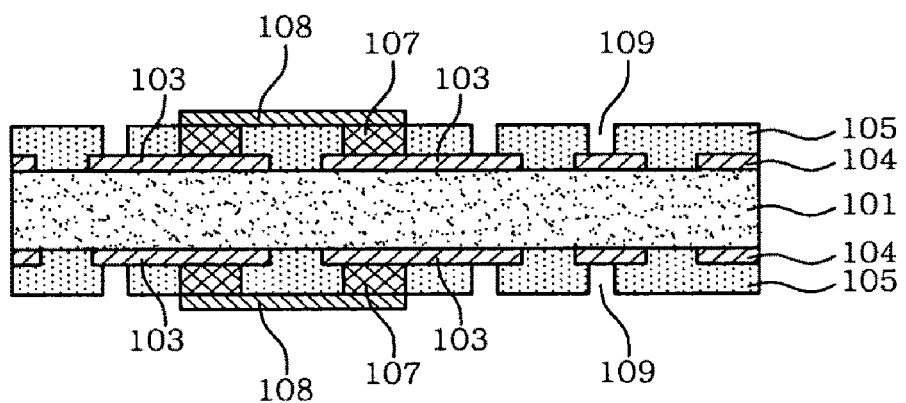

Subsequently, the resistors 108 are formed to a desired size such that the ends of each resistor are connected with two respective contact pads 107, which are formed as described above and are spaced apart from each other, (refer to FIG. 1F). In this case, it is preferred that the resistors 108 be formed to have a predetermined size through screen printing of resistor material, such as carbon-based paste, in the interests of economic efficiency, process efficiency and reliability, but the present invention is not limited only thereto. Accordingly, the prior art has a disadvantage in that the differences in height occur between pads and thus greatly affect the differences between resistance values, but the present invention can prevent the differences between resistance values from occurring because no such differences in height occur at all.

Figure 1G:
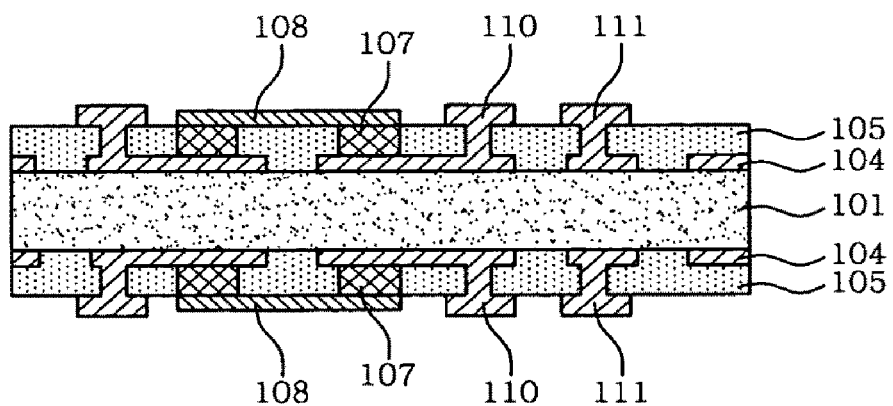
Figure 1H:
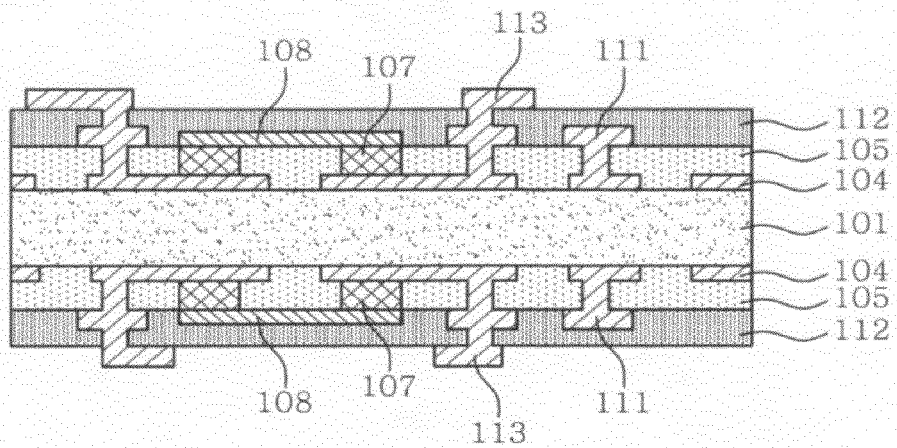
Figure 1H:
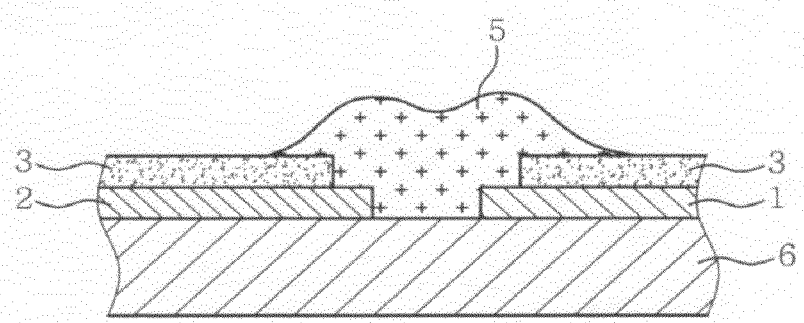
Figure 1H:
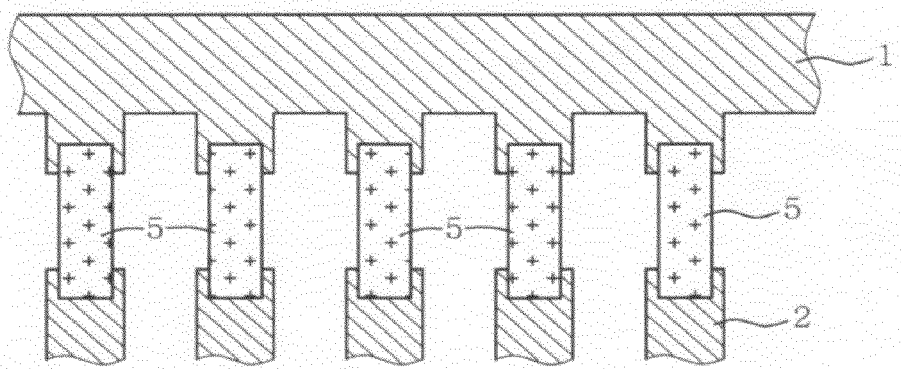

Thereafter, second via holes 109 for enabling interlayer electrical connections are formed by processing the insulating layers 105 at predetermined locations on the circuit patterns 103 and 104 (refer to FIG. 1F) and, thereafter, circuit patterns 110 and 111 are formed through general conductive metal plating/patterning processes (refer to FIG. 1G). As needed, a general laser trimming process may be further performed using the circuit patterns 110, which are formed in this process, as pads.

Thereafter, a final PCB having embedded resistors is manufactured by forming external layer circuit patterns 113 through a general process of layering insulating layers 112 and a general circuit forming process.

As needed, the number of circuit layers formed in an internal layer and on an external layer may be changed.

In this manner, the present invention uses a method of filling via holes formed on electrode pads with oxidation-resistant conductive material, forming the contact pads, and forming resistors on the contact pads, so that it can not only realize connections between circuits but also prevent erosion from occurring between the electrode pads and the resistors using the contact pads made of oxidation-resistant conductive material. In particular, the resistors are formed such that the ends of each resistor are connected to two respective contact pads, which are spaced apart from each other, at the surfaces of the contact pads, which are on the opposite side from the surfaces of the contact pads that are in contact with the electrode pads, and thus connected in the same plane without any difference in height, so that irregular resistance that occurs generally due to the difference in height can be eliminated, thereby achieving a great effect of reducing the differences between the resistance values of the embedded resistors.

Although the present invention has been described in detail with reference to the preferred embodiment as described above, this is only an exemplary embodiment for the purpose of describing the present invention in detail, and the PCB having embedded resistors and the method of manufacturing the same according to the present invention are not limited thereto. It will be apparent that various variations and modifications can be made within the technical spirit of the present invention by a person having ordinary knowledge in the art.

As described above, in accordance with the present invention, the contact pads are formed by filling the via holes formed on the electrode pad with oxidation-resistant conductive material, and the resistors are formed on the contact pads, so that the width and size of the designed resistors can be predicted because there is no difference in height between the pads. Furthermore, an electroless plating process, which is generally used to make the conductive material, such as Ag paste, can be omitted, and thus an advantage of reducing the cost can be achieved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board (PCB) having embedded resistors, the method comprising:
   providing a PCB on which internal layer circuit patterns, including electrode pads, are formed;
   layering insulating layers on the PCB;
   forming first via holes on the electrode pads and simultaneously forming second via holes at predetermined locations on the internal layer circuit patterns;
   forming contact pads for connecting the electrode pads with resistors by filling the first via holes with oxidation-resistant conductive material and flattening the oxidation-resistant conductive material;
   forming the resistors so that ends of each resistor are connected to two respective contact pads, which are spaced apart from each other;
   forming circuit patterns on the PCB, in which the second via holes are formed; and
   layering insulting layers on the PCB having the formed circuit patterns, and forming external layer circuit patterns.

2. The method as set forth in claim 1, wherein the oxidation-resistant conductive material is Ag paste.

3. The method as set forth in claim 1, wherein the filling of the oxidation-resistant conductive material is performed using screen printing.

4. The method as set forth in claim 1, wherein the flattening is performed through a mechanical polishing process, a chemical polishing process, or a chemical mechanical polishing process.

5. The method as set forth in claim 1, wherein the forming the resistors is performed through screen printing of resistor material.

6. The method as set forth in claim 5, wherein the resistor material is carbon-based paste.

7. The method as set forth in claim 1, further comprising performing laser trimming using the formed circuit patterns as pads.

8. A method of manufacturing a printed circuit board (PCB) having embedded resistors, the method comprising:
   providing a PCB on which internal layer circuit patterns, including electrode pads, are formed;
   layering insulating layers on the PCB;
   forming first via holes on the electrode pads;
   forming contact pads for connecting the electrode pads with resistors by filling the first via holes with oxidation-resistant conductive material and flattening the oxidation-resistant conductive material;
   forming the resistors so that ends of each resistor are connected to two respective contact pads, which are spaced apart from each other;
   forming second via holes at predetermined locations on the internal layer circuit patterns;
   forming circuit patterns on the PCB, in which the second via holes are formed; and
   layering insulting layers on the PCB having the formed circuit patterns, and forming external layer circuit patterns.

9. The method as set forth in claim 8, wherein the oxidation-resistant conductive material is Ag paste.

10. The method as set forth in claim 8, wherein the filling of the oxidation-resistant conductive material is performed using screen printing.

11. The method as set forth in claim 8, wherein the flattening is performed through a mechanical polishing process, a chemical polishing process, or a chemical mechanical polishing process.

12. The method as set forth in claim 8, wherein the forming the resistors is performed through screen printing of resistor material.

13. The method as set forth in claim 12, wherein the resistor material is carbon-based paste.

14. The method as set forth in claim 8, further comprising performing laser trimming using the formed circuit patterns as pads.

* * * * *